United States Patent
Thai et al.

(10) Patent No.: US 6,949,814 B2
(45) Date of Patent: Sep. 27, 2005

(54) MOUNTING MATERIAL, SEMICONDUCTOR DEVICE AND METHOD OF MANUFACTURING SEMICONDUCTOR DEVICE

(75) Inventors: Cao Minh Thai, Yokohama (JP); Hiroshi Tateishi, Yokohama (JP); Koichi Teshima, Tokyo (JP); Masahiro Tadauchi, Tokyo (JP); Izuru Komatsu, Yokohama (JP); Tetsuji Hori, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 105 days.

(21) Appl. No.: 10/252,088

(22) Filed: Sep. 23, 2002

(65) Prior Publication Data

US 2003/0111728 A1 Jun. 19, 2003

(30) Foreign Application Priority Data

Sep. 26, 2001 (JP) .................................. 2001-294856

(51) Int. Cl.⁷ ............................................. H01L 23/495
(52) U.S. Cl. .................... 257/676; 257/666; 257/669; 257/735
(58) Field of Search ................................ 257/735, 666, 257/676, 669

(56) References Cited

U.S. PATENT DOCUMENTS

| | | | |
|---|---|---|---|
| 5,468,993 A | * 11/1995 | Tani | 257/676 |
| 5,536,970 A | 7/1996 | Higashi et al. | |
| 5,817,208 A | * 10/1998 | Nose et al. | 156/500 |
| 5,864,470 A | * 1/1999 | Shim et al. | 361/777 |
| 6,225,701 B1 | 5/2001 | Hori et al. | |
| 6,645,792 B2 | * 11/2003 | Oga et al. | 438/123 |
| 6,717,242 B2 | * 4/2004 | Takeda et al. | 257/666 |

OTHER PUBLICATIONS

U.S. Appl. No. 11/058,323, filed Feb. 16, 2005, Takahashi et al.

* cited by examiner

Primary Examiner—Christian Wilson
Assistant Examiner—Douglas Menz
(74) Attorney, Agent, or Firm—Oblon, Spivak, McClelland, Maier & Neustadt, P.C.

(57) ABSTRACT

A semiconductor device, comprising a frame including a die pad and a lead portion; a semiconductor element; a wire including one end connected to the semiconductor element and another end connected to the lead portion; at least one first bonding portion formed of a solder material and bonding a part of an upper surface of the die pad to a part which is on a lower surface of the semiconductor element and which is opposed to the part of the upper surface of the die pad; and at least one second bonding portion formed of a thermosetting resin and bonding another part of the upper surface of the die pad to another part which is on the lower surface of the semiconductor element and which is opposed to said another part of the upper surface of the die pad.

12 Claims, 9 Drawing Sheets

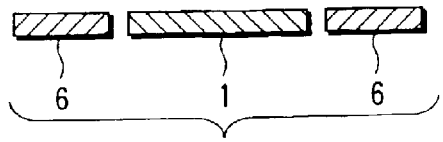
F I G. 6A
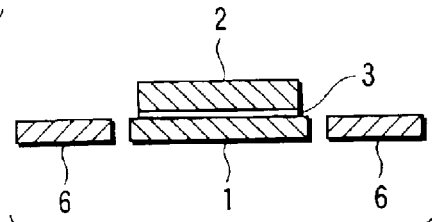
F I G. 7A
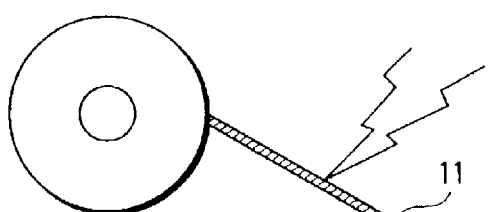
F I G. 6B
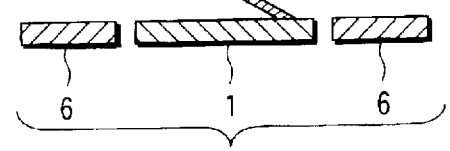
F I G. 6C
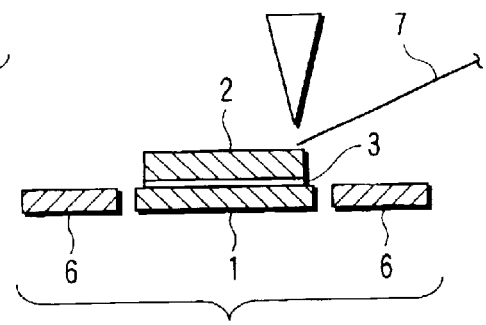
F I G. 7B
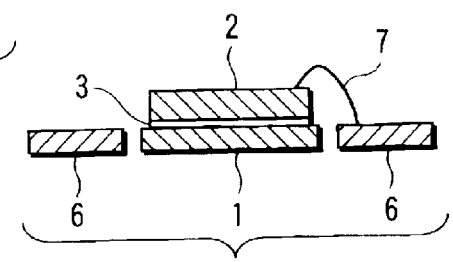
F I G. 7C

MOUNTING MATERIAL, SEMICONDUCTOR DEVICE AND METHOD OF MANUFACTURING SEMICONDUCTOR DEVICE

CROSS-REFERENCE TO RELATED APPLICATIONS

This application is based upon and claims the benefit of priority from the prior Japanese Patent Application No. 2001-294856, filed Sep. 26, 2001, the entire contents of which are incorporated herein by reference.

BACKGROUND OF THE INVENTION

1. Field of the Invention

The present invention relates to a mounting material, a semiconductor device using a mounting material, and a method of manufacturing a semiconductor device.

2. Description of the Related Art

The method of manufacturing a semiconductor device comprises a mounting step for mounting a semiconductor chip to a die pad by using a mounting material and the subsequent wire bonding step. In the wire bonding step, it is desirable to use a gold wire. And it is desirable for the wire bonding temperature to set the range of about 250° C. to 300° C. in order to increase the connecting strength of the gold wire. Therefore, the mounting material is required to be resistant to temperatures higher than the temperatures noted above. It should be noted in this connection that, if the mounting material is melted under the temperatures under which the gold wire is used, the semiconductor chip is detached from the die pad, resulting in failure to achieve the wire bonding. Under the circumstances, a silver paste or a high temperature solder having a melting point of about 300° C. is used as the mounting material in the semiconductor device nowadays.

The silver paste is generally used in a semiconductor device in the form of a dispersion prepared by dispersing a silver powder in various resins or in the form of a paste or a film. However, the silver paste is insufficient in its heat conductivity. Therefore, a high temperature solder containing at least 90% of lead is used in place of the silver paste in a semiconductor device such as a power device severely requiring the heat dissipation properties.

However, in view of the earth environment problem, a Pb-free solder attracts attentions in recent years. Also, the application of a legal regulation to the manufacture and trade of electronic appliances using a lead series solder is being conducted, making it necessary to take appropriately countermeasures promptly.

Under the circumstances, it is necessary to put a Pb-free solder to a practical use in a semiconductor device. Proposed in, for example, Japanese Patent Disclosure (Kokai) No. 11-172354 and Japanese Patent Disclosure No. 11-207487 are materials prepared by adding In or Sn to a Zn—Al—Mg series alloy as a Pb-free high temperature solder material having a melting point of about 300° C. Also, a solder material prepared by adding In or Sn to a Zn—Al—Ge series alloy is studied in Japanese Patent Disclosure No. 11-172353.

However, in any of the solder alloy materials proposed in the prior arts exemplified above, a liquid portion appears in the vicinity of 200° C. or 145° C. Therefore, if the solder alloy material is heated to a high temperature of about 250° C., the solder material is re-melted so as to give rise to an inconvenience that the semiconductor chip is detached from the die pad. In addition, the Zn—Al—Mg series alloy has a high brittleness, giving rise to the problem that the peeling takes place in the thermal impact test.

As described above, the Pb-free high temperature solder material, which is known to the art, is not suitable for the practical use and leaves room for further improvement in terms of the brittleness. Such being the situation, a Pb-free solder material is scarcely used in the semiconductor device nowadays.

BRIEF SUMMARY OF THE INVENTION

An object of the present invention is to provide a mounting material capable of improving the wire bonding strength between a die pad and a semiconductor element.

Another object of the present invention is to provide a semiconductor device capable of improving the wire bonding strength between a die pad and a semiconductor element.

Another object of the present invention is to provide a method of manufacturing a semiconductor device capable of improving the wire bonding strength in the wire bonding step between a die pad and a semiconductor element.

According to an aspect of the present invention, there is provided a semiconductor device comprising:

a frame including a die pad and a lead portion;

a semiconductor element;

a wire including one end connected to the semiconductor element and another end connected to the lead portion;

at least one first bonding portion formed of a solder material and bonding a part of the die pad to a part of the semiconductor element; and at least one second bonding portion formed of a thermosetting resin and bonding another part of the die pad to another part of the semiconductor element.

According to another aspect of the present invention, there is provided a mounting material comprising:

a solder material body including a hollow portion; and an adhesive loaded in the hollow portion of the solder material body and containing an uncured thermosetting resin.

According to another aspect of the present invention, there is provided a first method of manufacturing a semiconductor device, the semiconductor device comprising a semiconductor element and a frame, the frame including a die pad and a lead portion, the method comprising:

bonding a part of the die pad to a part of the semiconductor element by curing an uncured thermosetting resin;

soldering another part of the die pad to another part of the semiconductor element; and applying a wire bonding between the semiconductor element and the lead portion of the frame.

According to another aspect of the present invention, there is provided a second method of manufacturing a semiconductor device, the semiconductor device comprising a semiconductor element and a frame, the frame including a die pad and a lead portion, the method comprising:

soldering a part of the die pad to a part of the semiconductor element with a solder material;

applying an uncured thermosetting resin to surround the solder material;

curing the uncured thermosetting resin, whereby the thermosetting resin bonds another part of the die pad to another part of the semiconductor element; and applying a wire bonding between the semiconductor element and the lead portion of the frame.

Further, according to still another aspect of the present invention, there is provided a third method of manufacturing a semiconductor device, the semiconductor device comprising a semiconductor element and a frame, the frame including a die pad and a lead portion, the method comprising:

loading a mounting material in a clearance between the die pad and the semiconductor element, the mounting material including a composite body of an uncured thermosetting resin and a solder material;

melting the uncured thermosetting resin and the solder material;

curing the molten uncured thermosetting resin to bond a part of the die pad to a part of the semiconductor element;

solidifying the molten solder material to bond another part of the die pad to another part of the semiconductor element; and applying a wire bonding between the semiconductor element and the lead portion of the frame.

BRIEF DESCRIPTION OF THE SEVERAL VIEWS OF THE DRAWING

FIGS. 6A, 6B and 6C schematically exemplifies the mounting process in a third method of manufacturing a semiconductor device of the present invention;

FIGS. 7A, 7B and 7C schematically exemplifies the wire bonding process in the third method of manufacturing a semiconductor device of the present invention;

DETAILED DESCRIPTION OF THE INVENTION

Figure 1:
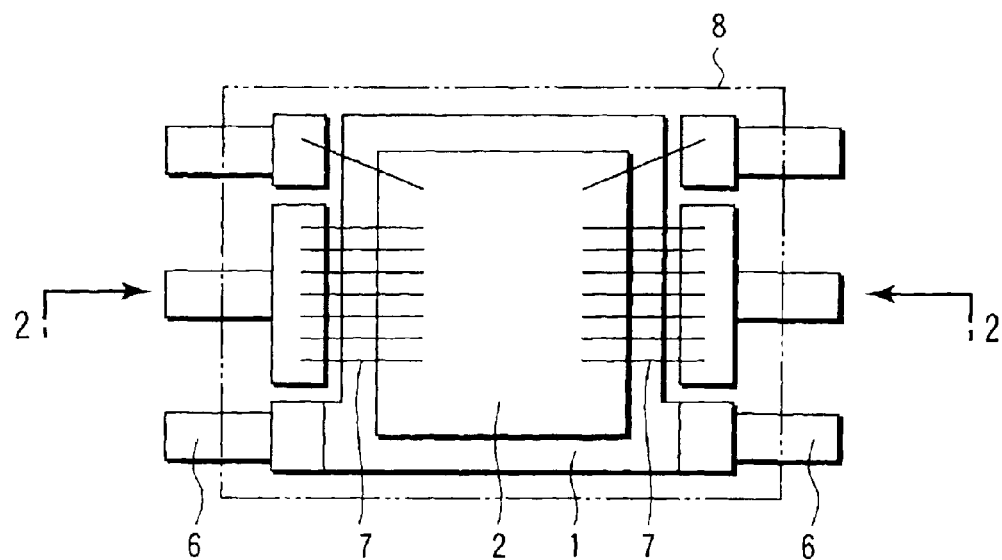
FIG. 1 schematically exemplifies one embodiment of a semiconductor device of the present invention.

The present inventors have found that, in order to prevent the semiconductor element (chip) from being detached from the die pad in the wire bonding step, particularly the wire bonding step using a gold wire, it is necessary to bond directly a part of the chip to the die pad with a solder material and to arrange a thermosetting resin, which is separated from the solder material, right below the chip in place of uniformly dispersing the thermosetting resin in the solder material. The present inventors have also found that, if the chip is bonded to the die pad under the particular condition, the thermosetting resin provisionally fixes the chip and the die pad in the wire bonding step so as to make it possible to perform the wire bonding using a gold wire even in the case of using a solder material having a low melting point, arriving at the present invention.

To be more specific, the present invention provides a semiconductor device comprising:

a frame including a die pad and a lead portion;

a semiconductor element;

a wire connecting the semiconductor element to the lead portion of the frame;

at least one first bonding portion formed of a solder material and bonding a part of the die pad to a part of the semiconductor element; and at least one second bonding portion formed of a thermosetting resin and bonding another part of the die pad to another part of the semiconductor element.

The semiconductor device that can be used in the present invention includes, for example, a transistor of about 200 A and not higher than 600V such as an intelligence power device (IPD) or a power MOS transistor.

In the bonding portion of the present invention, it is possible for the at least one second bonding portion to be positioned physically away from or physically in contact with the at least one first bonding portion.

Any kind of the thermosetting resin can be used in the present invention as far as the resin is cured by the heating and exhibits a resistance to heat in the wire bonding step such that the chip is not detached from the die pad. The specific examples of the thermosetting resin used in the present invention include an epoxy resin, a polyimide resin and bismaleimide resin. These resins can be used singly or in the form of a mixture of at least two of these resins. It is also possible to add as required a surfactant, a leveling agent, a catalyst, an antioxidant, or a solvent to these thermoplastic resins.

The specific epoxy resins used in the present invention include, for example, bisphenol A type epoxy resin, bisphenol F type epoxy resin, phenolic novolak type epoxy resin, cresol novolak type epoxy resin, naphthol series epoxy-novolak resin, bisphenol A type epoxy-novolak resin, naphthalene diol type epoxy resin, alicyclic epoxy resin, epoxy resin derived from tri(hydroxy phenyl)alkane, epoxy resin derived from tetra(hydroxy phenyl)alkane, bishydroxy biphenyl series epoxy resin, and epoxy compound of phenol aralkyl resin. In addition, other epoxy resins that are generally used can also be used in the present invention, and the epoxy resins used in the present invention are not particularly limited. These epoxy resins can be used singly or in the form of a mixture of at least two kinds of these epoxy resins.

The curing agents of the epoxy resins that are generally used can also be used as the curing agents of the epoxy resin in the present invention and, thus, the curing agents used in the present invention are not particularly limited. The specific curing agents of the epoxy resins used in the present invention include, for example, novolak type phenolic resin, phenol aralkyl resin, polyfunctional phenolic resin, phenolic resin having a terpene skeleton, and acid anhydride. The novolak phenolic resins noted above include, for example, phenolic novolak resin, cresol novolak resin, t-butyl phenol novolak resin, nonyl phenol novolak resin, bisphenol A type novolak resin, and naphthol series novolak resin. The phenol aralkyl resins noted above include, for example, poly-para-oxystyrene and condensation polymer compound between 2,2'-dimethoxy-p-xylene and phenol monomer. The polyfunctional phenolic compounds noted above include, for example, dicyclopentadiene phenol polymer, and tris (hydroxy phenyl)alkane. On the other hand, the acid anhydrides used in the present invention include, for example, phthalic anhydride, hexahydro phthalic anhydride, tetrahydro phthalic anhydride, and trimellitic anhydride. Among these resins, it is particularly desirable to use at least one of phenol novolak resins and phenol aralkyl resins as the curing agent of the epoxy resins. Incidentally, these curing agents can be used singly or in the form of a mixture of at least two of these resins.

Any kind of the solder material can be used in the present invention as far as the solder material exhibits a melting point (liquidus temperature) falling within a range of 150° C. to 300° C., though it is more desirable to use a solder material having a melting point (liquidus temperature) falling within a range of 180° C. to 280° C. Where the melting point is excessively low, the solder tends to be melted by the heat of the element during the use so as to lower the reliability. On the other hand, where the solder material has a melting point higher than 300° C., the soldering temperature is elevated, with the result that it is possible for the resin to fail to withstand the soldering temperature. The specific examples of the solder materials used in the present invention include the solder materials that do not contain Pb such as a Sn—Zn series material, a Sn—Ag series material, a Sn—Cu series material, and a Zn—Al—Mg—Sn series material. It is possible to add traces of additives such as Bi, Al and Ge to the solder materials noted above in order to improve the characteristics such as the wettability and the mechanical strength. Also, in the Sn—Zn series solder material, it is desirable for the Zn content to be set at 27% by weight or less. Also, in the Sn—Ag series solder material, it is desirable for the Sn content to be set at 10% by weight or less. On the other hand, in the Sn—Cu series solder material, it is desirable for the Cu content to be set at 3% by weight or less. Incidentally, in the present invention, it is possible to further improve the bonding strength in the wire bonding step between the die pad and the chip even in the case of using a solder material containing lead.

In the present invention, it is desirable for the at least one second bonding portion to be not larger than 25% by volume based on the total volume (100% by volume) of the at least first bonding portion and the at least second bonding portion. If the component of the thermosetting resin is contained in an amount larger than 25% by volume, the heat conductivity tends to be rendered poor so as to lower the heat dissipation properties of the semiconductor device. Also, if the amount of the thermosetting resin component is excessively small, the bonding strength between the chip and the die pad is rendered insufficient, with the result that it is possible for the chip to be detached from the die pad in the wire bonding step. It follows that it is more desirable for the amount of the at least one second bonding portion to fall within a range of 0.1 to 20% by volume.

In the semiconductor device of the present invention, it is desirable for the periphery of the chip to be bonded to the die pad by the at least one second bonding portion and for the inner region of the chip to be bonded to the die pad by the at least one first bonding portion. If a wire bonding is applied to the chip and the lead under temperatures not lower than 250° C. in the semiconductor device of the particular construction, the solder material is certainly melted under the high temperature. However, since the chip is bonded to the die pad by the at least one second bonding portion, the chip is prevented from being detached from the die pad. Also, since the at least one second bonding portion surrounds the at least one first bonding portion, the molten solder material is prevented from flowing out of the chip by the at least one second bonding portion, with the result that the chip and the die pad can be bonded to each other with a sufficiently high mechanical strength by the re-solidified solder material after the wire bonding step.

An example of the semiconductor device of the present invention will now be described with reference to FIGS. 1 to 3.

FIG. 1 schematically exemplifies one embodiment of the semiconductor device of the present invention. FIG. 2 is a cross sectional view along the line 2—2 shown in FIG. 1 schematically showing the construction of the semiconductor device shown in FIG. 1. Further, FIG. 3 shows in a magnified fashion the gist portion of the semiconductor device shown in FIG. 2.

As shown in the drawings, a semiconductor element (chip) 2 is bonded to a die pad 1 of a lead frame by a bonding layer 3. The bonding layer 3 includes a plurality of columnar second bonding portions 4 positioned right under the semiconductor element 2 and a plurality of first bonding portions 5. Each of the second bonding portions 4 is bonded directly to the die pad 1 and the semiconductor element 2. A lead portion 6 of the lead frame is bonded to an electrode (not shown) in the chip 2 via, for example, a gold wire 7. The semiconductor element 2 is sealed in a package 8 formed of, for example, a resin.

Figure 2:
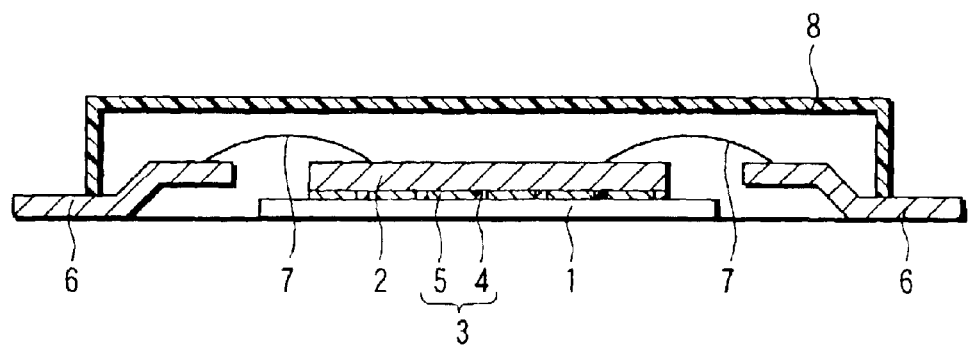
FIG. 2 is a cross sectional view along the line 2—2 shown in FIG. 1 schematically showing the construction of the semiconductor device shown in FIG. 1.
Figure 3:
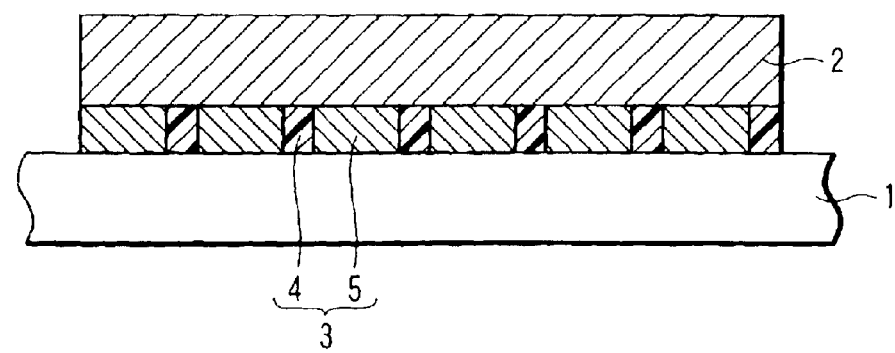
FIG. 3 shows in a magnified fashion the semiconductor device shown in FIG. 2.

As shown in FIGS. 1 to 3, it is possible for a plurality of second bonding portions 4 to be present at random in the bonding layer 3. Alternatively, it is possible for at least one second bonding portion 4 to be constructed as shown in FIGS. 4 and 5.

Figure 4:
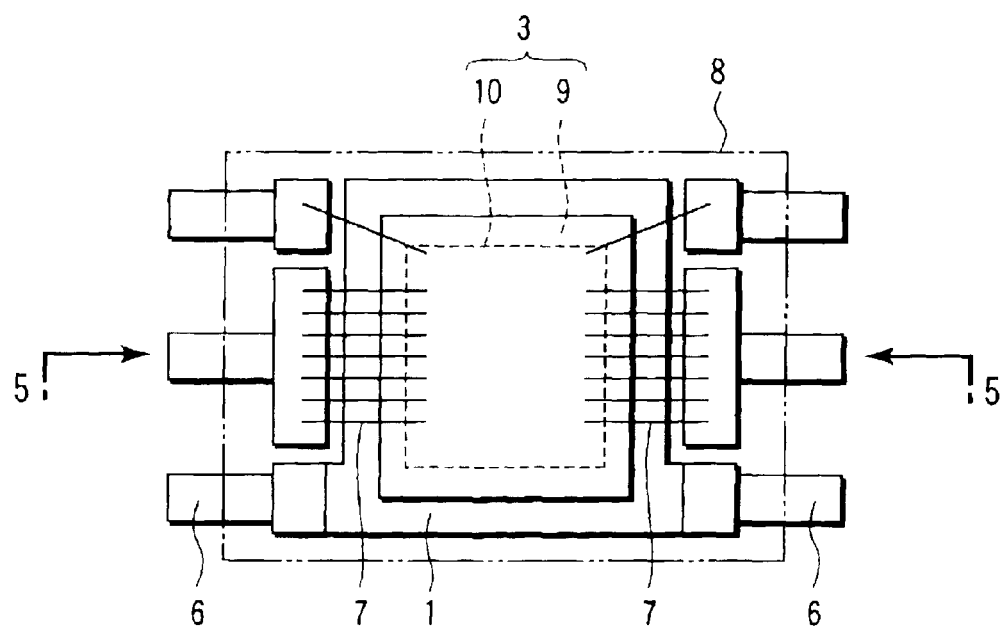
FIG. 4 schematically exemplifies another embodiment of a semiconductor device of the present invention.

FIG. 4 schematically shows the construction of another example of the semiconductor device of the present invention. FIG. 5 is a cross sectional view along the line 5—5 shown in FIG. 4 schematically showing the construction of the semiconductor device shown in FIG. 4. The members of the semiconductor device equal to those shown in FIGS. 1 to 3 are denoted by the same reference numerals in FIGS. 4 and 5 so as to avoid the overlapping description.

Figure 5:
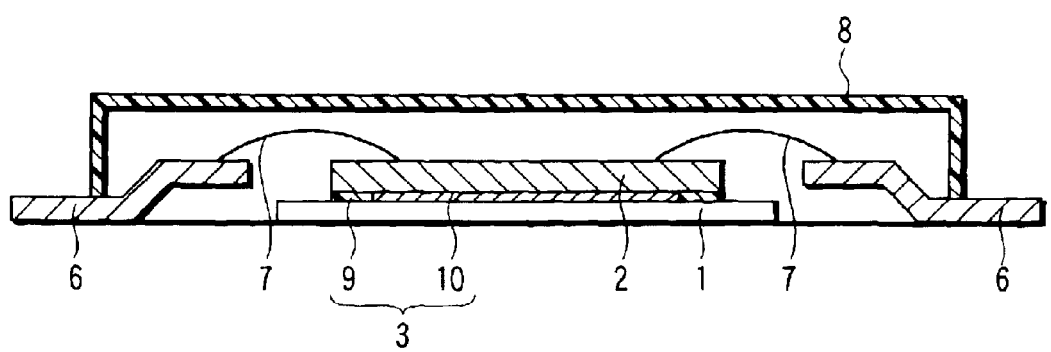
FIG. 5 is a cross sectional view along the line 5—5 shown in FIG. 4 schematically showing the construction of the semiconductor device shown in FIG. 4.

In the semiconductor device shown in FIGS. 4 and 5, the bonding layer 3 which serves to bond the semiconductor element (chip) 2 to the die pad 1 includes a second bonding portion 9 formed annular along the periphery of the chip 2 and a columnar first bonding portion 10 formed inside the annular portion 9.

Figure 18:
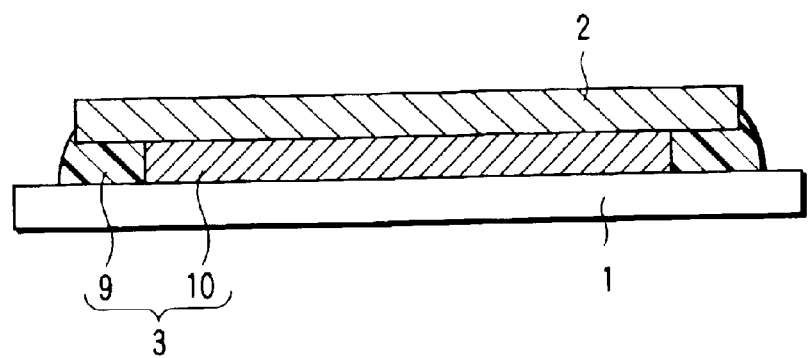
FIG. 18 shows in a magnified fashion the gist portion in another example of the semiconductor device of the present invention.

Incidentally, it is depicted in FIGS. 4 and 5 that the annular second bonding portion 9 is formed exactly along the periphery of the chip 2. However, it is more desirable for the second bonding portion 9 to be formed such that the second bonding portion 9 partly protrudes from the periphery of the chip 2 as shown in FIG. 18. In this case, the side surface of the chip 2 is surrounded by the protruding portion of the annular second bonding portion 9 so as to prevent more effectively the slippage of the chip 2 in the wire bonding step.

It should be noted that, in the semiconductor device of the construction described above, the second bonding portion 9 is bonded both to the chip 2 and to the die pad 1. It follows that, when a wire bonding is applied to the chip 2 and the lead frame 6 under the temperature condition not lower than 250° C., the chip 2 is prevented from being detached from the die pad 1. Also, since the first bonding portion 10 is surrounded by the second bonding portion 9, the molten solder material is prevented from flowing out of the chip 2 by the second bonding portion 9. It follows that, after the wire bonding step, the chip 2 can be bonded to the die pad 1 with a sufficiently high mechanical strength by the re-solidified solder material.

First to third methods of the present invention for manufacturing a semiconductor device will now be described.

A first method of the present invention for manufacturing a semiconductor device, comprises:

bonding a part of the die pad to a part of the semiconductor element by curing an uncured thermosetting resin;

soldering another part of the die pad to another part of the semiconductor element; and applying a wire bonding between the semiconductor element and the lead portion of the frame.

In the first method of the present invention for manufacturing a semiconductor device, it is possible to carry out simultaneously the curing reaction of the uncured thermosetting resin and the solidification of the solder material, or to carry out the solidification of the solder material after the curing reaction of the uncured thermosetting resin, or to carry out the curing reaction of the thermosetting resin after the solidification of the solder material. However, it is necessary to carry out the wire bonding step after the curing reaction of the uncured thermosetting resin.

It is desirable to form the at least one solder material bonding portion after formation of the at least one thermosetting resin bonding portion or to form simultaneously the at least one thermosetting resin bonding portion and the at least one solder material bonding portion. If the at least one thermosetting resin bonding portion is formed after formation of the at least one solder material bonding portion, it is possible for the solder material, which is melted again during the curing reaction, to flow out of the chip.

It is desirable for the melting point of the uncured thermosetting resin to be not higher than the soldering temperature. Where the melting point of the uncured thermosetting resin exceeds the soldering temperature, the resin is not melted at the soldering temperature, with the result that the chip is not bonded to the die pad. It follows that it is possible for the resin to fail to perform the function of an adhesive between the chip and the die pad.

Also, it is desirable for the gel time (time to cure) of the uncured thermosetting resin to be set at a level not longer than 30 minutes. If the gel time of the uncured thermosetting resin exceeds 30 minutes, the semiconductor element and the frame tend to be oxidized so as to lower the performance of the semiconductor device. In general, it is necessary for the uncured thermosetting resin to be cured promptly in order to ensure the productivity. Therefore, it is desirable for the gel time of the resin under the soldering temperature to be set at several seconds to several minutes. In order to shorten the gel time of the resin, a curing accelerator or a catalyst is added to the resin. Alternatively, the soldering temperature is set at a higher level.

The methods of loading a molten solder material and an uncured thermosetting resin in the clearance between the chip and the die pad include, for examples, methods (a) to (c) given below:

(a) An uncured thermosetting resin is attached to the back surface of a chip. Also, a solder material is disposed on the surface of the die pad, and the die pad is maintained at a soldering temperature so as to melt the solder material. Further, the chip and the die pad are superposed one upon the other, and a molten solder material and an uncured thermosetting resin are interposed between the chip and the die pad.

(b) An uncured thermosetting resin is attached to the back surface of the chip. Also, an uncured thermosetting resin and a solder material are disposed on the surface of the die pad, and the die pad is maintained at a soldering temperature so as to melt the resin and the solder material. Further, the chip and the die pad are superposed one upon the other, and the molten solder material and the uncured thermosetting resin are arranged between the chip and the die pad.

(c) An uncured thermosetting resin and a solder material are disposed on the surface of the die pad, and the die pad is maintained at a soldering temperature so as to melt the resin and the solder material. Further, a chip is superposed on the die pad so as to permit a molten solder material and an uncured thermosetting resin to be arranged between the chip and the die pad.

According to the first method of the present invention for manufacturing a semiconductor device, a molten solder material and an uncured thermosetting resin are present in a separated state from the first between the chip and the die pad, with the result that the chip is bonded to the die pad by the at least one second bonding portion that is partly positioned right under the chip and the at least one first bonding portion that is present independently of the at least one second bonding portion. It follows that it is possible to prevent the chip from being detached from the die pad in the subsequent wire bonding process.

A second method of the present invention for manufacturing a semiconductor device comprises:

soldering a part of the die pad to a part of the semiconductor element with a solder material;

applying an uncured thermosetting resin to surround the solder material;

curing the uncured thermosetting resin, whereby the thermosetting resin bonds another part of the die pad to another part of the semiconductor element; and applying a wire bonding between the semiconductor element and the lead portion of the frame.

In the particular method of the present invention for manufacturing a semiconductor device, it is possible to prevent the chip from being detached from the die pad in the wire bonding step. It is also possible to prevent the molten solder material from flowing to the outside of the semiconductor element. Also, in this case, it is desirable for the melting point of the uncured thermosetting resin to be lower than the melting point of the solder material. If the melting point of the uncured thermosetting resin is equal or higher than the soldering temperature, it is difficult for the bonding portion containing the solder material to be surrounded by the at least one second bonding portion because the solder material is melted by the heat in the step of loading the uncured thermosetting resin.

It is possible to form at least one second bonding portion in the clearance of the at least one first bonding portion after the partial bonding that the solder material is arranged at random. Also, it is possible for the resultant bonding portion to surrounded by a thermosetting resin.

A third method of the present invention for manufacturing a semiconductor device comprises:

loading a mounting material in a clearance between the die pad and the semiconductor element, the mounting material including a composite body of an uncured thermosetting resin and a solder material;

melting the uncured thermosetting resin and the solder material;

curing the molten uncured thermosetting resin to bond a part of the die pad to a part of the semiconductor element;

solidifying the molten solder material to bond another part of the die pad to another part of the semiconductor element; and applying a wire bonding between the semiconductor element and the lead portion of the frame.

In the third method of the present invention for manufacturing a semiconductor device, it is possible to carry out simultaneously the curing of the uncured thermosetting resin and the solidification of the solder material, to carry out the solidification of the solder material after the curing reaction of the uncured thermosetting resin, or to carry out the curing reaction of the thermosetting resin after solidification of the solder material. However, it is necessary to carry out the wire bonding step after the curing reaction of the uncured thermosetting resin.

It is desirable to form the at least one first bonding portion after formation of the at least one second bonding portion or to form simultaneously the at least one second bonding portion and the at least one first bonding portion. If the at least one second bonding portion is formed after formation of the at least first bonding portion, it is possible for the solder material melted again in the curing reaction step to flow out of the chip.

It is possible for the mounting materials to include materials (A) to (C) given below:

(A) It is possible to use as a mounting material a wire-like solder material having the surface covered with an adhesive containing an uncured thermosetting resin such as an enamel wire. It is possible to employ, for example, a coating method, a blowing method, an electrostatic coating method or a powder coating method for covering the wire-like solder material with an adhesive.

(B) It is possible to use as a mounting material a hollow solder material body having an adhesive containing an uncured thermosetting resin loaded in the hollow portion of the solder material body. To be more specific, it is possible obtain a mounting material by loading an uncured thermosetting resin in a hollow portion of an ingot of a solder material, followed by wire drawing the ingot loaded with the uncured thermosetting resin by using a molding device like a string solder.

(C) A mounting material is obtained by mixing a powder of a solder material and an adhesive containing an uncured thermosetting resin powder, followed by molding the resultant mixture into a desired shape.

It is possible to use, for example, an extruder, a press, or a roll as the molding device. Also, it is possible for the molding to be shaped like, for example, a wire, a rod, a thin foil, a film, a flake or a ball.

It is desirable for the melting point of the uncured thermosetting resin to be not higher than the soldering temperature. Where the melting point of the uncured thermosetting resin exceeds the soldering temperature, the resin is not melted at the soldering temperature and, thus, it is possible for the resin to fail to perform the function of an adhesive between the chip and the die pad.

Also, it is desirable for the gel time (time to cure) of the uncured thermosetting resin to be not longer than 30 minutes at the soldering temperature. If the gel time of the uncured thermosetting resin exceeds 30 minutes, the semiconductor element and the frame tend to be oxidized, resulting in lowered performance. In general, it is necessary for the uncured thermosetting resin to be cured promptly in order to ensure a sufficient productivity. Therefore, it is desirable for the gel time of the resin at the soldering temperature to fall within a range of between several seconds and several minutes. In order to shorten the gel time of the resin, a curing accelerator or a catalyst is added to the resin. Alternatively, the soldering temperature is set at a higher level.

It is desirable for the adhesive contained in any of the mounting materials (A) to (C) noted above to contain metal particles, alloy particles or both metal particles and alloy particles. The metal particles and the alloy particles used in the present invention are not particularly limited, as far as the particles have a high heat conductivity and a high resistance to oxidation. To be more specific, the metal particles used in the present invention include, for example, gold particles, silver particles, copper particles and aluminum particles. On the other hand, the alloy particles used in the present invention include, for example, particles of Sn—Zn series alloy, particles of Sn—Ag series alloy, particles of Sn—Cu series alloy, and particles of Zn—Al—Mg—Sn series alloy. Incidentally, it is desirable for the Zn content of the Sn—Zn series alloy particles to be not higher than 27% by weight. Also, it is desirable for the Sn content of the Sn—Ag series alloy particles to be not higher than 10% by weight. On the other hand, it is desirable for the Cu content of the Sn—Cu series alloy particles to be not higher than 3% by weight.

It is desirable for each of the metal particles and the alloy particles to have an average particle diameter falling within a range of 0.01 $\mu$m to 10 $\mu$m. The metal particles and the alloy particles having an average particle diameter falling within the range noted above can be dispersed sufficiently in the resin.

It is desirable for the mixing amount of at least one of the metal particles and the alloy particles to fall within a range of from 5 to 65% by volume with the volume of the adhesive set at 100% by volume. If the mixing amount of at least one of the metal particles and the alloy particles is smaller than 5% by volume, it is impossible to obtain a sufficient effect of improving the heat conductivity of the mounting material. On the other hand, if the mixing amount noted above exceeds 65% by volume, the viscosity of the resin rapidly increased, with the result that the flowability of the resin tends to be lowered under high temperatures. It is more desirable for the mixing amount of at least one of the metal particles and the alloy particles to fall within a range of 10% by volume to 55% by volume.

It is desirable for the adhesive included in any of the mounting materials (A) to (C) noted above to contain a solvent. It is desirable for the solvent used in the present invention to be low in volatility under room temperature and to be evaporated promptly at the soldering temperature such that the solvent does not remain in the bonding portion. Such being the situation, it is desirable for the boiling point of the solvent to fall within a range of 150° C. to 280° C. If the boiling point of the solvent is lower than 150° C., the solvent tends to be gradually evaporated during storage of the mounting material, leading to a low storage stability of the mounting material. On the other hand, if the boiling point of the solvent exceeds 280° C., the evaporating rate of the solvent is low in the soldering step. It follows that it is possible for the solvent to remain within the product so as to give detrimental effects to the product. The specific solvents that can be used in the present invention include, for example, diethylene glycol monoethyl ether acetate having a boiling point of 217° C., diethylene glycol ethyl ether having a boiling point of 180° C. to 190° C., diethyl benzene having a boiling point of 183° C., n-hexanol having a boiling point of 158° C., anisole having a boiling point of 157° C., n-butyl phenyl ether having a boiling point of 213° C., diisobutyl ketone having a boiling point of 168° C., cyclohexanone having a boiling point of 156° C., and ethyleneglycol having a boiling point of 198° C.

In the third method of the present invention for manufacturing a semiconductor device, a mounting material including a composite body of a solder material and an uncured thermosetting resin is loaded in the clearance between a semiconductor element (chip) and a die pad. In the mounting material noted above, the thermosetting resin and the solder material seemingly form a composite body and, thus, it seems difficult to obtain a bonding portion in which the thermosetting resin and the solder material are separated from each other. However, since the thermosetting resin and the solder material originally differ from each other in the surface tension and the viscosity, the thermosetting resin and the solder material are not compatible with each other when the resin and the solder material are melted together and, thus, are present independently like water and oil. It should be noted that, unless the uncured thermosetting resin and the solder material are present independently when the uncured thermosetting resin and the solder material are melted together, the resin comes to be present as fine particles within the solder material, with the result that the thermosetting resin fails to perform the function of an adhesive between the chip and the die pad.

If the mounting material containing a composite body of a solder material and an uncured thermosetting resin is heated, the uncured thermosetting resin and the solder material are melted out and are not mixed with each other because of the difference in the surface tension between the two. In addition, since the resin has a high flowability, the resin flows faster than the solder under the pressure in the soldering step so as to be collected the periphery of the chip. If the heating is continued under the particular state, the resin is cured so as to firmly fix the chip to the die pad. It follows that it is possible to carry out the wire bonding in which the chip is not detached from the die pad even if a high temperature solder having a melting point exceeding 300° C. is not used.

In the third method of the present invention for manufacturing a semiconductor device, it is desirable to use a mounting material (B) including a solder material that has a hollow portion and an adhesive that has an uncured thermosetting resin loaded in the hollow portion of the solder material. The particular mounting material (B) makes it possible to prevent the uncured thermosetting resin from absorbing moisture during storage of the mounting material. As a result, it is possible to prevent the foaming when the uncured thermosetting resin is cured. It follows that it is possible to prevent the thermal conductivity between the chip and the die pad from being impaired. In addition, the existing manufacturing apparatus used in using a resin-free solder material can be used, thereby it is possible to improve the performance of the semiconductor device without increasing the manufacturing cost.

The manufacturing method using the mounting material (B), which is included in the third method of the present invention for manufacturing a semiconductor device, will now be described in detail with reference to FIGS. 6 to 9.

Figure 8:
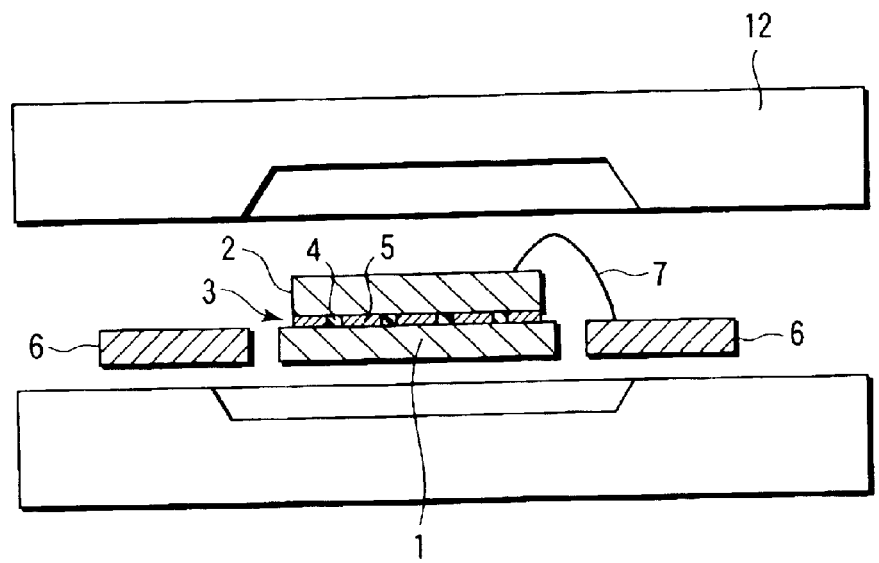
FIG. 8 schematically exemplifies the molding process in the third method of manufacturing a semiconductor device of the present invention.
Figure 9:
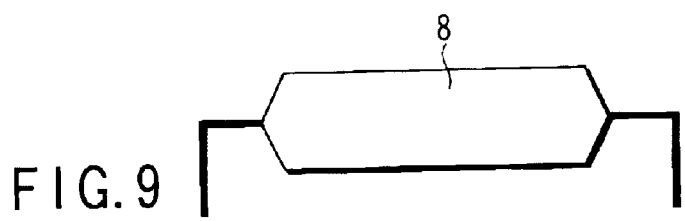
FIG. 9 schematically shows the semiconductor device after the molding process shown in FIG. 8.

FIGS. 6A to 6C schematically show the mounting process in an example of the third method of the present invention for manufacturing a semiconductor device. FIGS. 7A to 7C schematically show the wire bonding process in an example of the third method of the present invention for manufacturing a semiconductor device. FIG. 8 schematically shows the molding process in an example of the third method of the present invention for manufacturing a semiconductor device. Further, FIG. 9 schematically shows the semiconductor device after the molding process shown in FIG. 8. In FIGS. 6 to 9, the members of the semiconductor device equal to those shown in FIGS. 1 to 3 are denoted by the same reference numerals.

(Mounting Process)

In the first step, a lead frame as shown in FIG. 6A is heated. Then, a string solder 11 having an uncured thermosetting resin loaded therein as a mounting material (B) is mounted to a die pad 1, as shown in FIG. 6B. Further, a semiconductor element (chip) 2 is superposed on the die pad 1 to form a stacked structure, and the stacked structure is pressurized until the uncured thermosetting resin is cured as so as to form a plurality of second bonding portions, as shown in FIG. 6C.

(Wire Bonding Process)

As shown in FIG. 7A, the temperature of the semiconductor element 2 and the lead frame is set at about 300° C. Then, a wire bonding is performed by using a gold wire 7 so as to electrically connect the electrode of the semiconductor element 2 to a lead 6, as shown in FIG. 7B. Further, after completion of the wire bonding, the temperature of the semiconductor element 2 and the lead frame is lowered to room temperature, as shown in FIG. 7C.

(Molding Process)

The semiconductor element 2 is sealed by the resin molding by using a mold 12 shown in FIG. 8 so as to obtain a semiconductor device as shown in FIG. 9.

Some Examples of the present invention will now be described with reference to the accompanying drawings.

EXAMPLE 1

A varnish of resins was prepared by dissolving in a solvent FAE-2500 (trade name of a three functional epoxy resin manufactured by Nippon Kayaku K.K.), XL-225 (trade name of a phenolic curing agent manufactured by Mitsui Kagaku K.K.) and 2E4MZ-CN (trade name of an imidazole catalyst manufactured by Shikoku Kasei K.K.).

Then, the varnish of the resin was dripped by a dispenser onto four corner portions on the back surface of the chip so as to form four liquid droplets each having a diameter not larger than 1 mm, and the solvent in the resin varnish was evaporated on a hot plate. Further, a die pad having a silver plated thereto was heated to 250° C. under a nitrogen gas atmosphere, and a Sn—Zn eutectic solder having a melting point of 199° C. was disposed on the frame of the die pad. After confirmation of the melting of the solder, the chip noted above was disposed on the frame of the die pad and pressed stacked body for about 30 seconds for curing the resin. Still further, a wire bonding using a gold wire was performed by elevating the temperature to 300° C. It has been found that the chip was not detached from the die pad, supporting that the wire bonding was satisfactory.

Incidentally, the ratio in volume of the thermosetting resin to the total volume of the thermosetting resin and the solder material used in Example 1 was found to be 2% by volume.

EXAMPLE 2

A die pad plated with silver was heated to 250° C. under a nitrogen gas atmosphere, and a chip was soldered to the frame of the die pad by using a wire of a Sn—Zn25 solder having a melting point of 203° C. Then, the flame temperature was lowered to 200° C., and a liquid bismaleimide resin, i.e., N,N'-(4,4'-diphenyl-methane)bismaleimide, which was melted in advance, was dripped around the chip and left to stand for about 5 minutes so as to cure the resin. The ratio in volume of the thermosetting resin to the total volume of the thermosetting resin and the solder material was calculated on the basis of the total amount of the thermosetting resin used and the solder material used and was found to be 17% by volume.

The product obtained through the process described above was heated to 300° C. and a wire bonding was applied. The chip was not detached from the die pad, supporting that the wire bonding was satisfactory.

Figure 10:
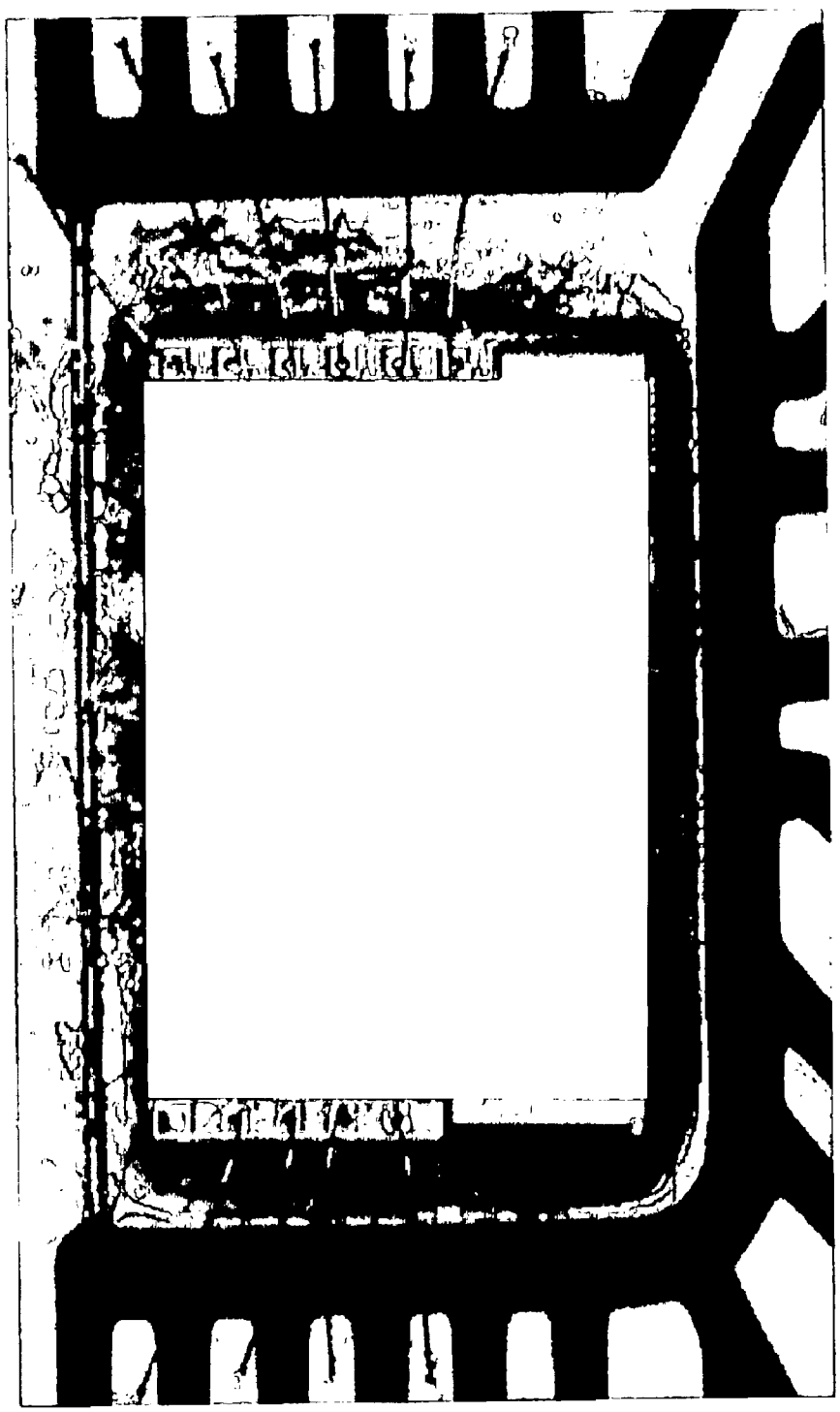
FIG. 10 is a stereoscopic microscope photograph showing the unsealed semiconductor device for Example 2, with the center portion of the semiconductor element covered.
Figure 11:
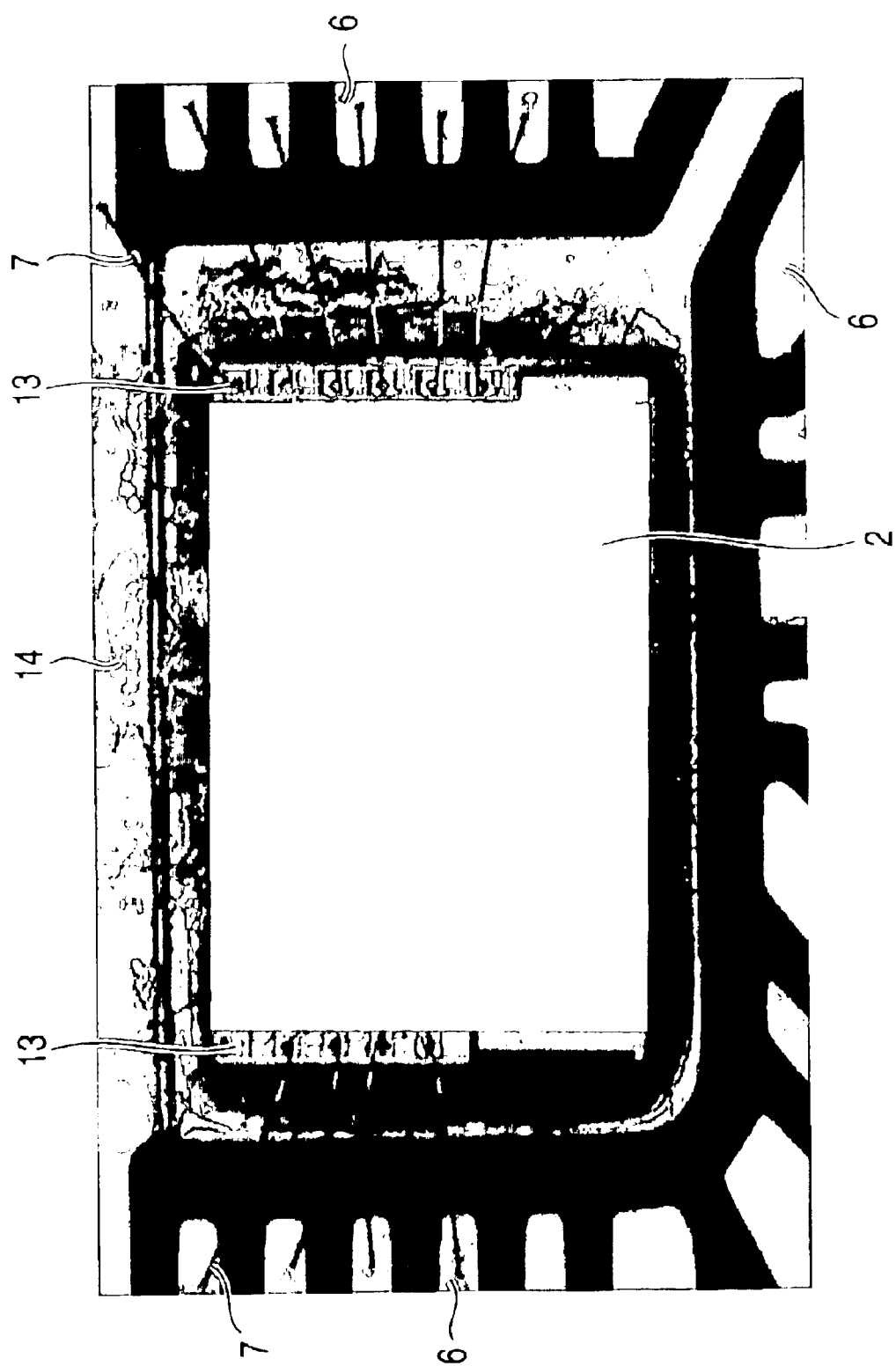
FIG. 11 is a schematic drawing for explaining the stereoscopic microscope photograph shown in FIG. 10.

FIG. 10 is a stereoscopic microscope photograph showing the unsealed semiconductor device for Example 2, with the center portion of the semiconductor element covered, and FIG. 11 is a schematic drawing for explaining the stereoscopic microscope photograph shown in FIG. 10.

As apparent from FIGS. 10 and 11, the gold wire 7 was connected at one end to the electrode 13 of the semiconductor element (chip 2) and at the other end to the lead portion 6 of the lead frame, supporting that the wire bonding was satisfactory. The second bonding portion 14 is formed between the periphery of the semiconductor element 2 and the die pad. Also, the outer peripheral portion of the second bonding portion 14 protrudes out of the semiconductor element 2. Further, at least one first bonding portion is present inside the second bonding portion 14, though the at least one first bonding portion cannot be recognized in the micrograph.

EXAMPLE 3

A varnish of an epoxy resin was prepared by dissolving Epicote 1004 (trade name of a bisphenol A type epoxy resin manufactured by Yuka Shell Inc.) and Shownole BRG556 (trade name of a phenolic curing agent manufactured by Showa Kobunshi Inc.) in a solvent of anisole manufactured by Tokyo Kasei K.K., followed by adding A-187 (trade name of a coupling material manufactured by Nippon Unicar Inc.), FC430 (trade name of a leveling material manufactured by 3M Inc. and 2E4MZ-CN (trade name of an imidazole catalyst manufactured by Shikoku Kasei K.K.).

A wire having a diameter of 0.8 mm and made of a Sn—Zn25 solder having a melting point of 203° C. was passed through the varnish prepared as above and, then, dried in a dryer of 100° C. until the wire was rendered tack-free so as to obtain a composite body of an uncured thermosetting resin and a solder material, the composite body forming a mounting material. The composite body thus obtained was weighed by an electronic balance. The ratio in volume of the thermosetting resin to the total volume of the thermosetting resin and the solder material was calculated on the basis of the weight of the composite body thus obtained and was found to be 5.4% by volume.

A die pad plated with silver was heated to 250° C. under a nitrogen gas atmosphere, and the composite body noted above was put on the frame of the die pad and left to stand for several seconds. After it was confirmed that the solder and the uncured thermosetting resin had been melted and separated from each other, the chip was disposed on the frame of the die pad and depressed lightly. Then, the temperature was elevated to 300° C. for carrying out the subsequent wire bonding step, and the wire bonding step was carried out. The chip was not detached from the die pad, supporting that the wire bonding was satisfactory.

EXAMPLE 4

A bismaleimide resin, i.e., 2,2'-bis[4(4-maleimide phenoxy)phenyl]propane, was put in a container and heated to 170° C. Then, a wire of a Sn—Zn25 solder having a diameter of 0.8 mm and a melting point of 203° C., which was similar to that used in Example 2, was passed through the bismaleimide resin. Since a solvent was not contained in the bismaleimide resin, the solder wire was rendered tack-free when cooled to room temperature so as to make it unnecessary to employ drying. The mounting material thus obtained was weighed by an electronic balance. The attached amount of the bismaleimide resin was found to be 10.2% by volume based on the volume of the entire mounting material.

A die pad plated with silver was heated to 250° C. under a nitrogen gas atmosphere and, then, the composite body noted above was disposed on the frame of the die pad and left to stand for about 3 seconds. After it was confirmed that the solder and the bismaleimide resin were melted so as to be separated from each other, a chip was disposed on the frame of the die pad and pressurized lightly. Then, the temperature was elevated to 300° C. in preparation for the subsequent wire bonding step, and a wire bonding step was applied. The chip was not detached from the die pad, supporting that the wire bonding was satisfactory.

EXAMPLE 5

A powder of bismaleimide resin, i.e., N,N'-(4,4'-diphenyl methane)bismaleimide, and a solder powder of a Sn—Cu eutectic alloy having a melting point of 227° C. were mixed under the powdery state at a volume ratio of 5:95. Then, a rod having a diameter of 0.8 mm was prepared from the powdery mixture by a compression molding using a hot press so as to obtain a mounting material.

A die pad plated with silver was heated to 250° C. under a nitrogen gas atmosphere and, then, the mounting material noted above was disposed on the frame of the die pad and left to stand for several seconds. After it was confirmed that the solder and the bismaleimide resin were melted so as to be separated from each other, a chip was disposed on the frame of the die pad and pressurized lightly. Then, the temperature was elevated to 300° C. in preparation for the subsequent wire bonding step, and a wire bonding step was applied. The chip was not detached from the die pad, supporting that the wire bonding was satisfactory.

EXAMPLE 6

A hole was made in a Sn-2Cu ingot, and a bismaleimide resin, i.e., N,N'-(4,4'-diphenyl methane)bismaleimide, was loaded in the hole in a volume ratio of 10%, followed by preparing from the ingot a string solder having an outer diameter of 1 mm and containing the bismaleimide resin, thereby obtaining a mounting material.

A die pad plated with silver was heated to 250° C. under a nitrogen gas atmosphere and, then, the mounting material noted above was disposed on the frame of the die pad and left to stand for several seconds. After it was confirmed that the solder and the bismaleimide resin were melted so as to be separated from each other, a chip was disposed on the frame of the die pad and pressurized lightly. Then, the temperature was elevated to 300° C. in preparation for the subsequent wire bonding step, and a wire bonding step was applied. The chip was not detached from the die pad, supporting that the wire bonding was satisfactory.

EXAMPLE 7

An uncured polyimide resin was blown by a spraying against a Sn—Ag series solder ball having a diameter of 1 mm and a melting point of 221° C. so as to dry the solder ball until the solder ball was rendered tack-free, thereby obtaining a mounting material. The weights of the solder ball before and after the resin blowing were measured so as to calculate the attached amount of the resin based on the volume of the entire mounting material. The attached amount of the resin was found to be 0.5% by volume.

A die pad plated with silver was heated to 250° C. under a nitrogen gas atmosphere and, then, the mounting material noted above was disposed on the frame of the die pad and left to stand for several seconds. After it was confirmed that the solder and the bismaleimide resin were melted so as to be separated from each other, a chip was disposed on the frame of the die pad and pressurized lightly. Then, the temperature was elevated to 300° C. in preparation for the subsequent wire bonding step, and a wire bonding step was applied. The chip was not detached from the die pad, supporting that the wire bonding was satisfactory.

COMPARATIVE EXAMPLE 1

A die pad plated with silver was heated to 250° C. under a nitrogen gas atmosphere, and a chip was soldered to the frame of the die pad by using a Sn—Zn25 solder wire having a melting point of 203° C. and a diameter of 0.8 mm, which did not contain at all a resin. Then, the temperature was elevated to 300° C. in preparation for the subsequent wire bonding step. The chip was detached from the die pad and, thus, it was impossible to carry out the wire bonding.

COMPARATIVE EXAMPLE 2

A varnish of an epoxy resin was prepared by dissolving Epicote 1004 (trade name of a bisphenol A type epoxy resin manufactured by Yuka Shell Inc.) and Shownole BRG556 (trade name of a phenolic curing agent manufactured by Showa Kobunshi Inc.) in a solvent of anisole manufactured by Tokyo Kasei K.K., followed by adding A-187 (trade name of a coupling material manufactured by Nippon Unicar Inc.), FC430 (trade name of a leveling material manufactured by 3M Inc. and 2E4MZ-CN (trade name of an imidazole catalyst manufactured by Shikoku Kasei K.K.).

A wire having a diameter of 0.8 mm and made of a Sn—Zn25 solder having a melting point of 203° C. was passed through the varnish prepared as above and, then, dried in a dryer of 100° C. until the wire was rendered tack-free. Further, the temperature of the dryer was elevated to 180° C. so as to perform an additional drying for 3 hours. The resin was already cured in this stage and was not melted even if the resin was further heated.

A die pad plated with silver was heated to 250° C. under a nitrogen gas atmosphere, and the solder wire covered with the thermosetting resin was put on the frame of the die pad and left to stand for several seconds. Since the resin was not melted, the solder and the resin were not separated from each other and were left as they were. When a chip was disposed on the frame of the die pad and pressurized lightly, the resin was collapsed and the solder within the resin was exposed to the outside.

Then, the temperature was elevated to 300° C. in an attempt to carry out a wire bonding. However, the chip was detached from the die pad so as to make it impossible to carry out the wire bonding.

As apparent from the experimental data for Examples 1 to 7 and Comparative Examples 1 and 2, it has been clarified that, in Examples 1 to 7 of the present invention, the chip is not detached from the wire in the wire bonding step in spite of the fact that a solder material having a low melting point was used in these Examples of the present invention, supporting that it is possible to carry out the wire bonding under the ordinary conditions. In other words, the effectiveness of the present invention has been confirmed.

Figure 12:
FIG. 12 is a stereoscopic microscope photograph showing the state that the mounting material for Example 3 is melted.
Figure 13:
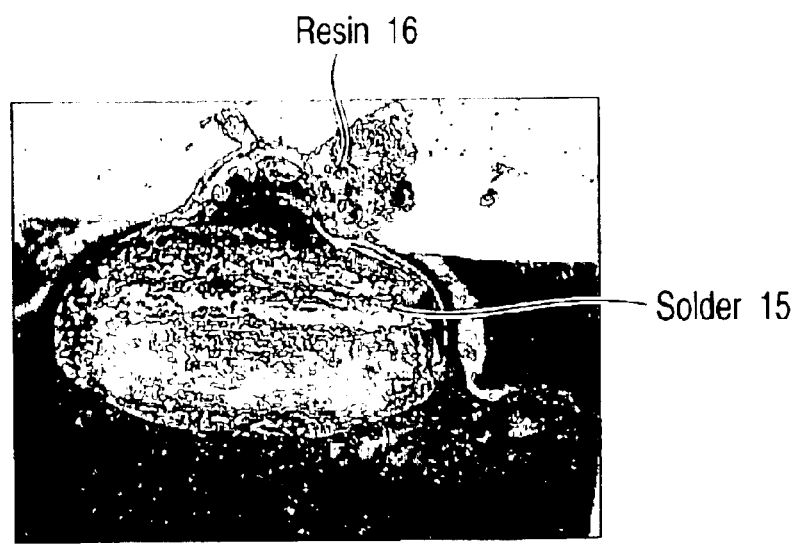
FIG. 13 is a schematic drawing for explaining the stereoscopic microscope photograph shown in FIG. 12.

FIG. 12 is a stereoscopic microscope photograph having a magnification 20 and showing the molten state of a solder coated with a resin. Specifically, the surface of a Sn—Zn25 solder having a melting point of 203° C. was coated with a bismaleimide resin, i.e., 2,2'-bis[4(4-maleimide phenoxy) phenyl]propane, equal to that used in Example 4 by the method similar to that employed in Example 4, followed by heating the coated solder, which was held between glass plates, so as to melt the solder and the resin. The stereoscopic microscope photograph in FIG. 12 shows the molten state of the solder coated with the resin. FIG. 13 is a schematic drawing for explaining the stereoscopic microscope photograph shown in FIG. 12.

FIGS. 12 and 13 clearly show that the molten solder material 15 is separated from the molten resin 16.

Figure 14:
FIG. 14 is a stereoscopic microscope photograph showing the state that the mounting material for Example 5 is melted.
Figure 15:
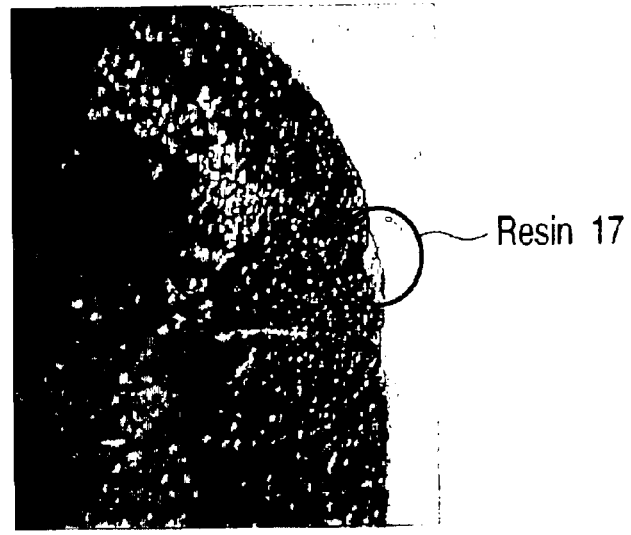
FIG. 15 is a schematic drawing for explaining the stereoscopic microscope photograph shown in FIG. 14.
Figure 16:
FIG. 16 is another stereoscopic microscope photograph showing the state that the mounting material for Example 5 is melted.
Figure 17:
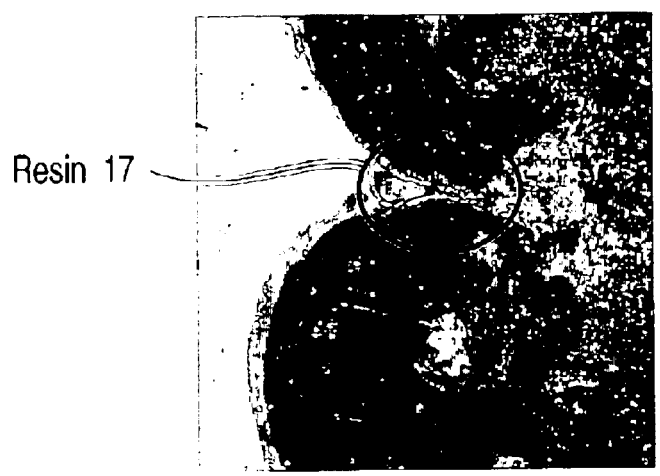
FIG. 17 is a schematic drawing for explaining the stereoscopic microscope photograph shown in FIG. 16.

Further, FIG. 14 is a stereoscopic microscope photograph having a magnification 20 and showing the molten state of a solder and a resin. Specifically, a powder of bismaleimide, i.e., N,N'-(4,4'-diphenyl-methane)bismaleimide, was mixed with a powder of Sn—Cu eutectic solder having a melting point of 227° C. in a powdery state at a mixing ratio by volume of 5:95. Then, the powdery mixture was molded into a plate and held between glass plates, followed by melting the solder and the bismaleimide resin by the heating. The stereoscopic microscope photograph in FIG. 14 shows the molten state of the solder and the resin, and FIG. 16 is a stereoscopic microscope photograph having a magnification 20. On the other hand, FIG. 15 is a schematic drawing for explaining the stereoscopic microscope photograph shown in FIG. 14. Also, FIG. 17 is a schematic drawing for explaining the stereoscopic microscope photograph shown in FIG. 16.

FIGS. 14 to 17 show that a molten resin 17 floats on the surface of the mounting material.

Also, in order to examine the humidity resistance of the mounting materials used in Examples 3 to 7, the obtained mounting materials were stored under a humid environment having a humidity of 80% at 25° C. for 24 hours. Then, a chip was bonded to the die pad by using the mounting material, and the bonded portion was photographed with an X-ray photography so as to measure the occurrence of bubbles in the bonded portion between the die pad and the chip. Table 1 shows the results.

TABLE 1

| | Mounting material | Solder material | Uncured thermosetting resin | Bubble occurrence rate X in bonded portion (%) |
|---|---|---|---|---|
| Example 3 | Solder material was coated with resin | Sn—Zn25 | Epoxy resin | 7.2 |
| Example 4 | Solder material was coated with resin | Sn—Zn25 | Bismaleimide resin | 7.5 |
| Example 5 | Molding of mixed powder | Sn—Cu eutectic | Bismaleimide resin | 8.3 |
| Example 6 | String solder containing resin | Sn-2Cu | Bismaleimide resin | 4.8 |
| Example 7 | Solder material was coated with resin | Sn—Ag | Polyimide resin | 6.2 |

$X = (A_1/A_2) \times 100$.

X (%) is the bubble occurrence rate, $A_1$ is an area of generated bubble, $A_2$ is an entire bonded portion.

As apparent from Table 1, the use of the mounting material for Example 6 (string solder containing resin) was most effective for suppressing the bubble generation in the bonded portion.

EXAMPLE 8

Mixed were a solvent FAE-2500 (trade name of a three functional epoxy resin manufactured by Nippon Kayaku K.K.), XL-225 (trade name of a phenolic curing agent manufactured by Mitsui Kagaku K.K.), 2E4MZ-CN (trade name of an imidazole catalyst manufactured by Shikoku Kasei K.K.) and AY-6080 (trade name of a silver powder manufactured by Tanaka Kikinzoku Inc. and having an average particle diameter of 0.2 to 1 μm). The mixing ratio of the silver powder in the mixture was 10% by volume.

<Preparation of Solder>

A hole was made in a Sn-2Cu ingot, and the mixture noted above was loaded in the hole of the ingot such that the ratio of the mixture was 10% by volume on the basis that the sum of the ingot and the mixture was 100% by volume, followed by molding the ingot loaded with the mixture so as to prepare a string having an outer diameter of 1 mm, thereby preparing a mounting material and obtaining a string solder containing an epoxy resin to which was added a silver powder.

<Soldering>

A die pad plated with silver was heated to 250° C. under a nitrogen gas atmosphere and, then, the mounting material noted above was disposed on the frame of the die pad and left to stand for several seconds. After it was confirmed that the solder and the epoxy resin were melted so as to be separated from each other, a chip was disposed on the frame of the die pad and pressurized lightly. Then, the temperature was elevated to 300° C. in preparation for the subsequent wire bonding step, and a wire bonding step was applied. The chip was not detached from the die pad, supporting that the wire bonding was satisfactory.

The heat dissipation properties of the chip thus obtained were examined. The heat dissipation properties of the chip were found to have been improved by 5%, compared with the resin to which a silver powder was not added.

EXAMPLE 9

A mounting material was obtained as in Example 8, except that the mixing amount of the silver powder in the mixture was set at 50% by volume.

A die pad plated with silver was heated to 250° C. under a nitrogen gas atmosphere and, then, the mounting material noted above was disposed on the frame of the die pad and left to stand for several seconds. After it was confirmed that the solder and the epoxy resin were melted so as to be separated from each other, a chip was disposed on the frame of the die pad and pressurized lightly. Then, the temperature was elevated to 300° C. in preparation for the subsequent wire bonding step, and a wire bonding step was applied. The chip was not detached from the die pad, supporting that the wire bonding was satisfactory.

The heat dissipation properties of the chip thus obtained were examined. The heat dissipation properties of the chip were found to have been improved by 20%, compared with the resin to which a silver powder was not added.

EXAMPLES 10 TO 12

A mounting material was prepared as in Example 8, except that the kind of the particles that added to the resin and the addition amount of the particles that added to the resin were changed as shown in Table 2.

A die pad plated with silver was heated to 250° C. under a nitrogen gas atmosphere and, then, each of the mounting materials noted above was disposed on the frame of the die pad and left to stand for several seconds. After it was confirmed that the solder and the epoxy resin were melted so as to be separated from each other, a chip was disposed on the frame of the die pad and pressurized lightly. Then, the temperature was elevated to 300° C. in preparation for the subsequent wire bonding step, and a wire bonding step was applied. The chip was not detached from the die pad, supporting that the wire bonding was satisfactory.

The heat dissipation properties of the chip thus obtained were examined. Table 2 shows the improvement in the heat dissipation properties of the chip, compared with the resin to which a silver powder was not added.

TABLE 2

| | Solder material | Uncured thermosetting resin | Kind of additional particles | Addition amount (% by volume) of additional particles | Average particle diameter of additional particles (μm) | Improvement of heat dissipation properties (%) |
|---|---|---|---|---|---|---|
| Example 8 | Sn-2Cu | Epoxy resin | Ag | 10 | 0.2–1 | 5 |
| Example 9 | Sn-2Cu | Epoxy resin | Ag | 50 | 0.2–1 | 20 |
| Example 10 | Sn-2Cu | Epoxy resin | Sn-2Cu | 25 | 1–3 | 9 |
| Example 11 | Sn-25Zn | Epoxy resin | Sn-2Cu | 25 | 1–3 | 9.5 |
| Example 12 | Sn-25Zn | Epoxy resin | Sn—Ag | 25 | 1–3 | 10 |

EXAMPLE 13

<Preparation of Resin>

Mixed were a solvent FAE-2500 (trade name of a three functional epoxy resin manufactured by Nippon Kayaku K.K.), XL-225 (trade name of a phenolic curing agent manufactured by Mitsui Kagaku K.K.), 2E4MZ-CN (trade name of an imidazole catalyst manufactured by Shikoku Kasei K.K.) and a solvent of anisole. The mixing ratio of the solvent in the mixture was 10% by volume.

<Preparation of Solder>

A hole was made in a Sn-25Zn ingot, and the mixture noted above was loaded in the hole of the ingot such that the ratio of the mixture was 10% by volume on the basis that the sum of the ingot and the mixture was 100% by volume, followed by molding the ingot loaded with the mixture so as to prepare a string having an outer diameter of 1 mm, thereby preparing a mounting material and obtaining a string solder containing an epoxy resin to which was added a solvent.

<Soldering>

A die pad plated with silver was heated to 250° C. under a nitrogen gas atmosphere and, then, the mounting material noted above was disposed on the frame of the die pad and left to stand for several seconds. After it was confirmed that the solder and the epoxy resin were melted so as to be separated from each other, a chip was disposed on the frame of the die pad and pressurized lightly. Then, the temperature was elevated to 300° C. in preparation for the subsequent wire bonding step, and a wire bonding step was applied. The chip was not detached from the die pad, supporting that the wire bonding was satisfactory.

The heat dissipation properties of the chip thus obtained were examined. The heat dissipation properties of the chip were found to have been improved by 10%, compared with the resin to which a solvent was not added.

EXAMPLES 14 TO 17

A mounting material was prepared as in Example 13, except that the kinds of the volatile solvents and the addition amounts of the volatile solvents were changed as shown in Table 3.

A die pad plated with silver was heated to 250° C. under a nitrogen gas atmosphere and, then, each of the mounting materials noted above was disposed on the frame of the die pad and left to stand for several seconds. After it was confirmed that the solder and the epoxy resin were melted so as to be separated from each other, a chip was disposed on the frame of the die pad and pressurized lightly. Then, the temperature was elevated to 300° C. in preparation for the subsequent wire bonding step, and a wire bonding step was applied. The chip was not detached from the die pad, supporting that the wire bonding was satisfactory.

The heat dissipation properties of the chip thus obtained were examined. Table 3 also shows the improvement in the heat dissipation properties of the chip, compared with the resin to which a solvent was not added.

TABLE 3

| | Solder material | Uncured thermosetting resin | Kinds of volatile solvents | Boiling points (° C.) of volatile solvents | Addition amounts of volatile solvents (% by volume) | Improvement of heat dissipation properties (%) |
|---|---|---|---|---|---|---|
| Example 13 | Sn-25Zn | Epoxy resin | Anisole | 157 | 10 | 10 |
| Example 14 | Sn-25Zn | Epoxy resin | Anisole | 157 | 15 | 12 |
| Example 15 | Sn-25Zn | Epoxy resin | Diethyl benzene | 183 | 10 | 12 |
| Example 16 | Sn-25Zn | Epoxy resin | n-butyl phenyl ether | 213 | 10 | 9 |
| Example 17 | Sn-25Zn | Epoxy resin | Diethylene glycol monoethyl ether acetate | 217 | 10 | 7 |

As described above, the present invention provides a mounting material capable of improving the bonding strength between the die pad and the chip in the wire bonding step. Also, the present invention provides a semiconductor device capable of improving the bonding strength between the die pad and the chip in the wire bonding step. Further, the present invention provides a method of manufacturing a semiconductor device capable of improving the bonding strength between the die pad and the chip in the wire bonding step.

Additional advantages and modifications will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device, comprising:
   a frame including a die pad and a lead portion;
   a semiconductor element;
   a wire including one end connected to the semiconductor element and another end connected to the lead portion;
   at least one first bonding portion formed of a solder material and bonding a part of an upper surface of the die pad to a part which is on a lower surface of the semiconductor element and which is opposed to the part of the upper surface of the die pad; and
   at least one second bonding portion formed of a thermosetting resin and bonding another part of the upper surface of the die pad to another part which is on the lower surface of the semiconductor element and which is opposed to said another part of the upper surface of the die pad.

2. The semiconductor device according to claim 1, wherein said at least one second bonding portion is columnar.

3. The semiconductor device according to claim 1, wherein said at least one second bonding portion is surrounding said at least one first bonding portion.

4. The semiconductor device according to claim 1, wherein a ratio of said at least one second bonding portion to a total amount of said at least one first bonding portion and said at least one second bonding portion is not larger than 25% by volume.

5. The semiconductor device according to claim 1, wherein said at least one second bonding portion is formed of at least one kind of resin selected from the group consisting of an epoxy resin, a polyimide resin and a bismaleimide resin.

6. The semiconductor device according to claim 5, wherein a melting point of said at least one first bonding portion falls within a range of 150° C. to 300° C.

7. The semiconductor device according to claim 1, wherein said at least one first bonding portion is formed of at least one kind of an alloy selected from the group consisting of a Pb-free alloy containing Sn and Zn, a Pb-free alloy containing Sn and Ag, a Pb-free alloy containing Sn and Cu, a Pb-free alloy containing Zn, Al, Mg and Sn, a Pb-free alloy containing Sn and Zn and at least one kind of element selected from the group consisting of Bi, Al and Ge, a Pb-free alloy containing Sn and Ag and at least one kind of element selected from the group consisting of Bi, Al and Ge, a Pb-free alloy containing Sn and Cu and at least one kind of element selected from the group consisting of Bi, Al and Ge, and a Pb-free alloy containing Zn, Al, Mg and Sn and at least one kind of element selected from the group consisting of Bi, Al and Ge.

8. The semiconductor device according to claim 1, wherein a ratio of said at least one second bonding portion to a total amount of said at least one first bonding portion and said at least one second bonding portion falls within a range of 0.1 to 20% by volume.

9. The semiconductor device according to claim 1, wherein a melting point of said at least one first bonding portion falls within a range of 180° C. to 280° C.

10. The semiconductor device according to claim 1, wherein said at least one second bonding portion is formed between a peripheral portion of the lower surface of the semiconductor element and a part which is on the upper surface of the die pad and which is opposed to the peripheral portion, and said at least one first bonding portion is formed between an internal portion which is internal of the peripheral portion of the lower surface of the semiconductor element, and a part which is on the upper surface of the die pad and which is opposed to the internal portion.

11. The semiconductor device according to claim 1, wherein said at least one first bonding portion and said at least one second bonding portion are columnar in shape.

12. The semiconductor device according to claim 1, wherein said wire comprises gold.

* * * * *